(12) United States Patent
Ko

(10) Patent No.: US 6,372,556 B1
(45) Date of Patent: Apr. 16, 2002

(54) SEMICONDUCTOR DEVICE HAVING A FUSE AND FABRICATING METHOD THEREFOR

(75) Inventor: Jang-Man Ko, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/514,947

(22) Filed: Feb. 28, 2000

(30) Foreign Application Priority Data

Oct. 20, 2000 (KR) .......................................... 99-45494

(51) Int. Cl.[7] .............................................. H01L 21/82
(52) U.S. Cl. ...................................... 438/132; 438/601
(58) Field of Search ................................. 438/128, 132, 438/529, 600, 601, 624, 778, 786, 308, 239, 130, 129

(56) References Cited

U.S. PATENT DOCUMENTS

| | | | | |
|---|---|---|---|---|
| 4,210,464 A | * | 7/1980 | Tanaka et al. ............... | 438/778 |
| 6,016,001 A | * | 1/2000 | Sanchez et al. ............. | 257/530 |
| 6,168,984 B1 | * | 1/2001 | Yoo et al. .................... | 438/239 |

* cited by examiner

Primary Examiner—David Nelms
Assistant Examiner—Phuc T. Dang
(74) Attorney, Agent, or Firm—The Law Offices of Eugene M. Lee, P.L.L.C.

(57) ABSTRACT

A semiconductor device having a fuse includes a first insulating layer that has a predetermined metal wire, a second insulating layer that has a heat blocking layer being positioned over the predetermined metal wire, and an upper layer. The upper layer includes a deposition structure having a fuse metal layer and a wiring metal layer. The fuse metal layer has a fuse pattern that is used as a fuse and is exposed via a fuse window in the upper layer. The fuse pattern is electrically connected to the wiring metal layer. The semiconductor device is designed so that the heat blocking layer is larger than the fuse window and is positioned under the fuse metal layer. The semiconductor device is further constructed with the fuse metal layer being formed on the metal wire, thereby preventing limitations in the layout arrangement or in the fabrication process in order to achieve a high degree of integration. A method of manufacturing the above semiconductor device is also described.

10 Claims, 6 Drawing Sheets

SEMICONDUCTOR DEVICE HAVING A FUSE AND FABRICATING METHOD THEREFOR

BACKGROUND OF THE INVENTION

The present invention relates to a semiconductor device and fabricating method thereof. More particularly, the invention is directed to a semiconductor device that includes a fuse for re-routing circuit paths and to a method of making the semiconductor device. The present invention allows for a high integration of the semiconductor device by having the fuse formed on top of a metal conductor.

DESCRIPTION OF THE RELATED ART

When a defect is detected in any of the plurality of the fine cells of a semiconductor device, e.g. a complex semiconductor device or a semiconductor memory device, during fabrication, the device is deemed defective. This is because the defective cells will cause a malfunction in the semiconductor device. Even if a defect is found in only part of the semiconductor device, the whole device is classified as defective and destroyed as defective goods. This significantly decreases the productive yield of final products.

Currently, memory devices are embedded with redundant cells that are used for replacing any defective cells, thereby saving the entire semiconductor memory device and improving the overall product yield. Using redundant cells involves installing spare rows and columns at predetermined intervals during the manufacturing process. The defective cells are removed from their respective row and column locations and are replaced with spare memory cells. In other words, if a defective cell is detected during a wafer-level test, a program is run for changing the address of the defective cell to an address of a spare cell. Therefore, when the address of a defective cell line is actually requested, a spare cell line is selected instead of the defective cell line. One of the programming methods for changing the addresses of the cells involves cutting a fuse with a laser beam. The fuse is usually made on a metal layer in the semiconductor device.

FIGS. 1 and 2 are views illustrating the structure of a conventional semiconductor device having a fuse, where FIG. 2 is a cross-sectional view illustrating the structure taken along the A—A line shown in FIG. 1. A semiconductor device includes a substrate 10, a plurality of interlevel insulating layers 14, 18, 24, and a plurality of metal wires 12, 16, 22. A fuse pattern 28 is formed on the third interlevel insulating layer 24 and comprises a fuse metal layer 28a. A conductive plug 20 electrically connects the second metal wire 16 with the third metal wire 22. After the fuse pattern 28 and the metal wire 26 are formed on the third interlevel insulating layer 24, protection layers 29 and 30 are then formed on the resulting structure.

The fuse pattern 28 comprises a deposition structure having a fuse metal layer and a wiring metal layer. The structure is arranged on the insulating plate 24 and is integrally connected with the metal wire 26 on the uppermost layer. Fuse I is formed from a portion of the fuse pattern 28 and is made in a single structure with an open fuse window W.

When a fuse metal layer 28a is formed on the insulating plate over the metal wires 12, 18, 24 for the purpose of improving the integration of the device, thermal damage can occur to the metal wires positioned under the fuse. That is, when using a laser beam to cut the fuse, the underlying metal wires may be damaged by the thermal energy of the laser beam. Consequently, the reliability of the metal wires can be greatly reduced. Therefore, there is an urgent need to improve the structure of the semiconductor device containing a fuse and solve the aforementioned problems.

SUMMARY OF THE INVENTION

Therefore, a feature of the present invention is to provide a semiconductor device having a fuse and a heat blocking layer which is larger than a fuse window. The heat blocking layer is placed under a fuse metal layer. Even if a metal wire were to be placed under the fuse metal layer, thermal damage can be prevented when the fuse is cut by a laser beam. As a result, a fuse can be formed on the metal wire while achieving a high integration of the semiconductor device.

Another feature of the present invention includes a semiconductor device comprising: a first insulating layer which comprises a predetermined metal wire therein; a second insulating layer which comprises a heat blocking layer therein, wherein the heat blocking layer is positioned over the predetermined metal wire; and an upper layer which comprises a deposition structure having a fuse metal layer and a wiring metal layer, the fuse metal layer comprises a fuse pattern that is to be used as a fuse and is exposed via a fuse window in the upper layer, wherein the fuse pattern is electrically connected to the wiring metal layer, and the heat blocking layer is positioned under the fuse metal layer and is larger than the fuse window.

Still another feature of the present invention is to provide a method for fabricating a semiconductor device having a fuse, comprising the steps of forming a first interlevel insulating layer on a semiconductor substrate having a first metal wire, forming a second metal wire on the first interlevel insulating layer, forming a second interlevel insulating layer on the first interlevel insulating layer, forming a hole and a grooved portion for exposing a surface of the second metal wire embedded in the second interlevel insulating layer by selectively etching out a first predetermined region and a second predetermined region of the second interlevel insulating layer, respectively, forming a conductive plug in the hole and a heat blocking layer in the grooved portion from a metal, forming a third metal wire on the second interlevel insulating layer for connection with the conductive plug, forming a third interlevel insulating layer on the second interlevel insulating layer, simultaneously forming a fuse pattern in a deposition structure of a,fuse metal layer and a wiring metal layer on the third interlevel insulating layer, and forming a fourth metal wire for connection with a lateral edge of the fuse pattern.

The present invention will now be described fully hereinafter with reference to the accompanying drawings, in which the preferred embodiments of the invention are shown. This invention may, however, be embodied in different forms and should not be construed as limited to the embodiments set forth herein. Rather, these embodiments are provided so that this disclosure will fully convey the scope of the invention to those skilled in the art. In the drawings, the thickness of layers and regions are exaggerated for clarity. It is also to be understood that when a layer is referred to as being on another layer or substrate, it can be directly on the other layer or substrate, or intervening layers may also be present.

The invention may be understood and its features will become apparent to those skilled in the art by reference to the accompanying drawings as follows.

DETAILED DESCRIPTION OF THE PRESENT INVENTION

Applicant's Korean Patent Application No. 99-45494, filed Oct. 20, 1999, is incorporated herein by reference as if fully set forth herein.

Applicant's present invention is to provide a method for fabricating a semiconductor device having a fuse, wherein a heat blocking layer is formed in a self-alignment manner during the course of forming the wires without an additional process.

To accomplish the aforementioned features of the present invention, disclosed is a semiconductor device that has a fuse pattern being made in the deposition structure of a "fuse metal layer/wiring metal layer" on an insulating plate. The deposition structure is electrically connected with a metal wire installed at the uppermost layer. A portion of a fuse pattern is to be used as a fuse and is formed in the structure of a fuse metal layer which is exposed via a fuse window. A heat blocking layer is positioned under the fuse metal layer and is larger than the fuse window. A predetermined metal wire is arranged by inserting an insulating layer under the heat blocking layer.

With reference to the drawings, the structure of the semiconductor device will be described in detail below. In the preferred embodiment of the present invention, a semiconductor device is constructed with four layer metal wires.

Figure 1:
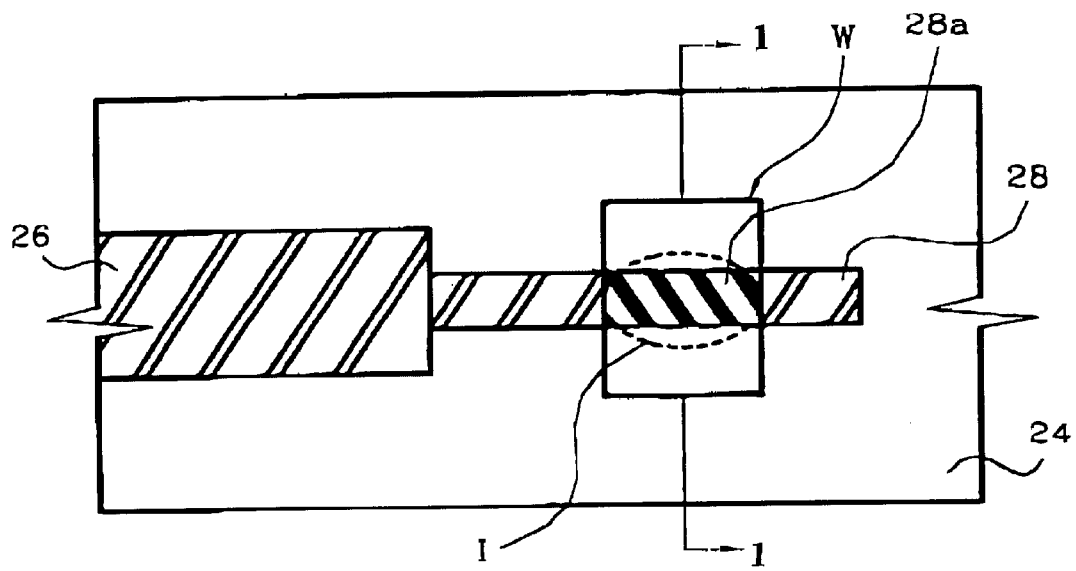
FIG. 1 illustrates the plane structure of a conventional semiconductor device having a fuse.
Figure 2:
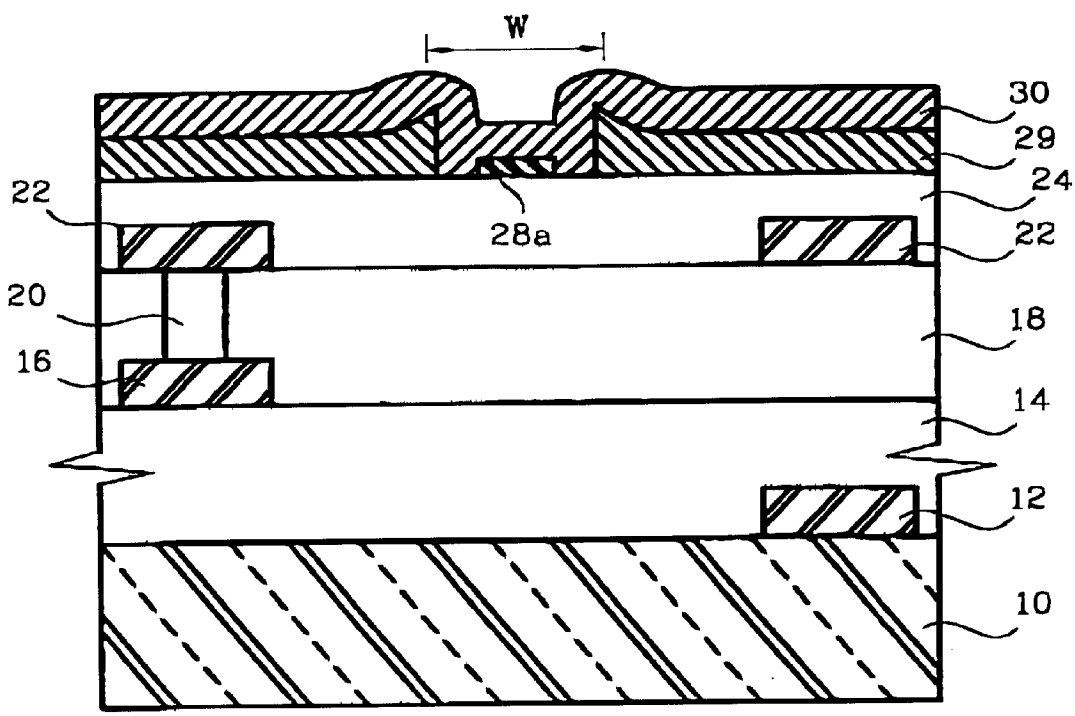
FIG. 2 is a cross-sectional view illustrating the semiconductor device taken along the A–A' line in FIG. 1.
Figure 3:
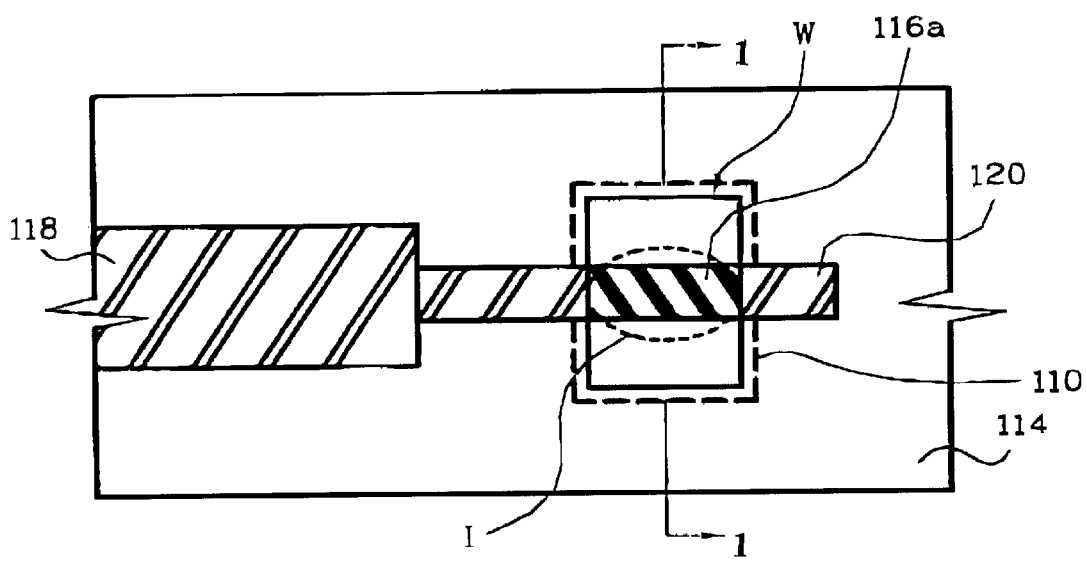
FIG. 3 illustrates a plane structure of a semiconductor device having a fuse in accordance with the present invention.

FIG. 3 shows a plane structure of a semiconductor device having a fuse in accordance with the present invention. A fuse pattern 120 is placed on an interlevel insulating layer 114. Further shown is a fuse metal layer 116a, a fuse window W and a fuse I. The fuse pattern is electrically connected to a metal wire 118.

Figure 4:
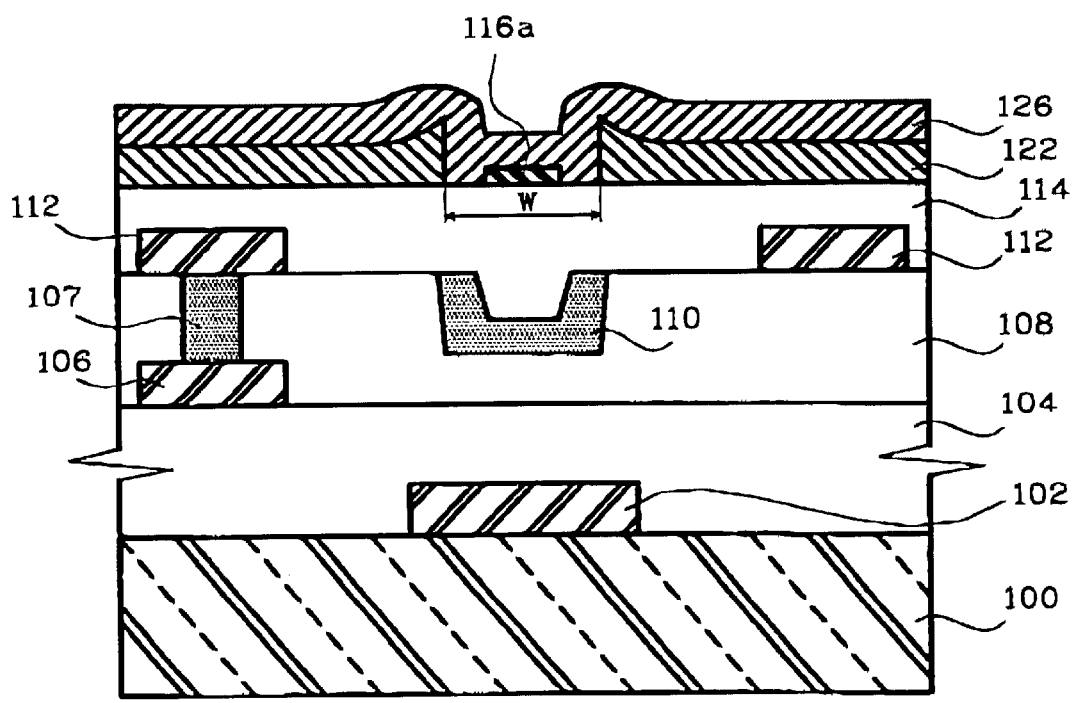
FIG. 4 is a cross-sectional view illustrating the semiconductor device taken along the A–A' line in FIG. 3.

FIG. 4 shows a cross-sectional view of the semiconductor device taken along the A–A' line in FIG. 3.

Still, with reference to FIGS. 3 and 4, the semiconductor device of the present invention includes a substrate 100, a plurality of interlevel insulating layers 104, 108, 114 and a plurality of metal wires 102, 106 and 112. A fuse pattern 120 is formed in the deposition structure of the fuse metal layer 116a and the wiring metal layer 116b (FIGS. 8 and 9) on the third interlevel insulating layer 114. The fuse pattern 120 connects with the uppermost layer of a fourth metal wire 118. A portion of the fuse pattern 120 is to be used as a fuse I and is formed in the single structure of the fuse metal layer 116a and may be opened through a fuse window W. A heat blocking layer 110, which is larger than the fuse window, is inserted into the second interlevel insulating layer 108 under the fuse metal layer 116a. A conductive plug 107 connects the second metal wire 106 and the third metal wire 112. It should be noted that the semiconductor substrate 100 can include other transistors and electrical lines thereunder although they are not shown. The semiconductor device further includes a first protective layer 122 and a second protective layer 126. The protective layers are placed on top of the third interlevel insulating layer for covering the deposition structure of the fuse pattern 120, the fourth metal wire 118 and the fuse metal layer 116a.

The fuse metal layer 116a can be made in either a single structure of Titanium (Ti) or Titanium Nitrate (TIN), a deposition structure of Titanium (Ti) and Titanium Nitrate (TIN), or a deposition structure of Titanium and Tungsten (Ti/W). The heat blocking layer 110 is made of Tungsten (W) or Copper (Cu).

The method for the fabrication of the semiconductor device according to the present invention is done by the sequential steps as shown in FIGS. 5–10. It is noted that the actual sequential processes of fabricating the semiconductor device are illustrated using the cross-sectional view taken along the A–A' line of FIG. 3.

Figure 5:
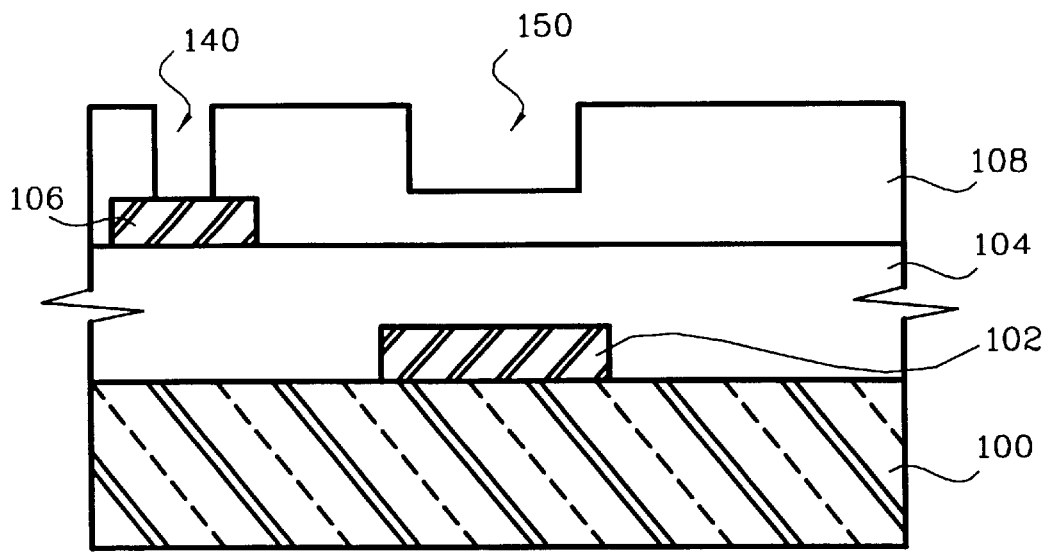
FIGS. 5–10 illustrate the sequential processes of fabricating the semiconductor device as shown in FIG. 4.

As shown in FIG. 5, a first interlevel insulating layer 104 is formed on a semiconductor substrate 100 already having a first metal wire 102 formed thereon. A second metal wire 106 is then formed on the first interlevel insulating layer 104. A second interlevel insulating layer 108 is then formed on the first interlevel insulating layer 104 having the second metal wire 106. Both, the first wire 102 and the second metal wire 106 are made of either Aluminum (Al) or Copper (Cu) alloys. A first region which defines a wiring portion and a second region which defines a fuse window in the second interlevel insulating layer 108 are selectively etched out to a predetermined thickness for respectively forming a hole 140 and a grooved portion 150. The etched out region for the hole 140 will expose a predetermined portion of the second metal wire 106 and a predetermined portion of the insulating layer 108. The grooved portion 150 is formed a little larger than an actual size of a fuse window W, which is to be formed in a later step.

Figure 6:
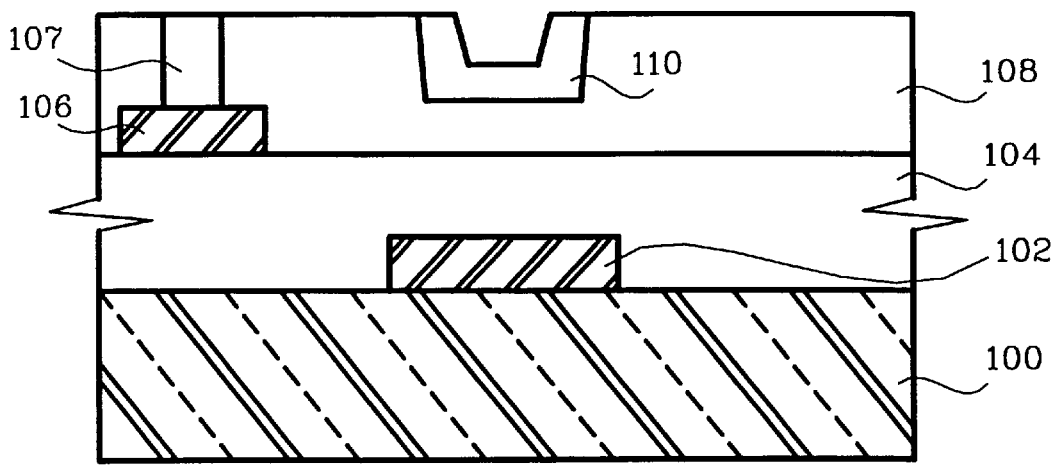

As shown in FIG. 6, a metal layer of Tungsten (W) or Copper (Cu) is formed on the second interlevel insulating layer 108 for completely filling the hole 140 and the groove portion 150. Then, either a chemical mechanical polishing (CMP) process or an etch-back process is performed on the metal layer of Tungsten (W) or Copper (Cu). As a result, a conductive plug 107 and a heat blocking layer 110 are formed in the hole 140 arid groove portion 150, respectively. The conductive plug 107 provides an electrical conduit for connecting upper and lower metal wires, such as providing an electrical connection between the first metal wire 106 and any metal wires placed on the conductive plug 107. The heat blocking layer 110 is used to protect the lower metal wires from heat which is generated during the process of cutting the fuse with a laser beam.

Figure 7:
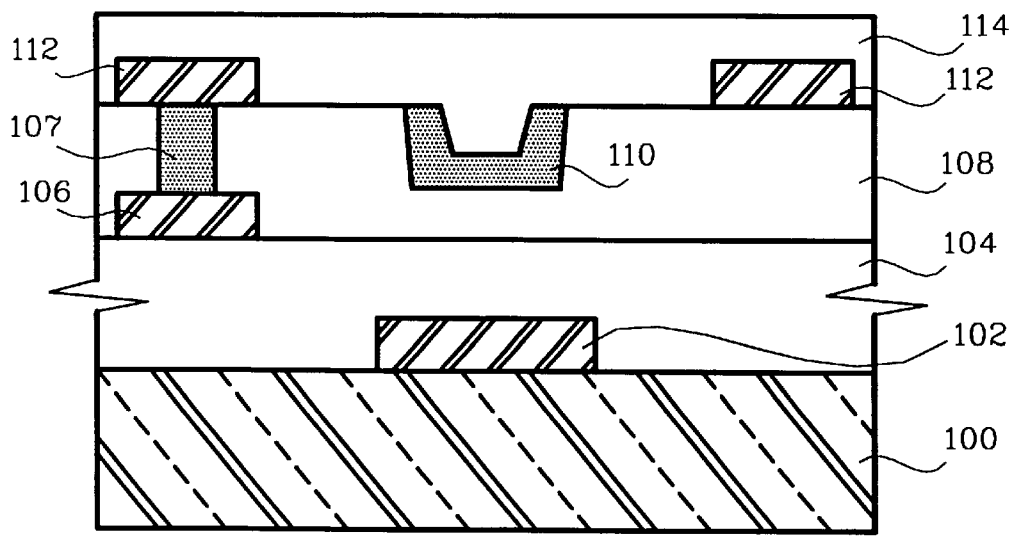

With reference to FIG. 7, the method continues with a third metal wire 112 being formed on the second interlevel insulating layer 108. The third metal wire 112 is connected to the second metal wire 106 via the conductive plug 107. A third interlevel insulating layer 114 is formed all over the structure resulted by the previous fabrication steps. In a preferred embodiment, the third metal wire 112 is made of either an Aluminum (Al) or Copper (Cu) alloys.

Figure 8:
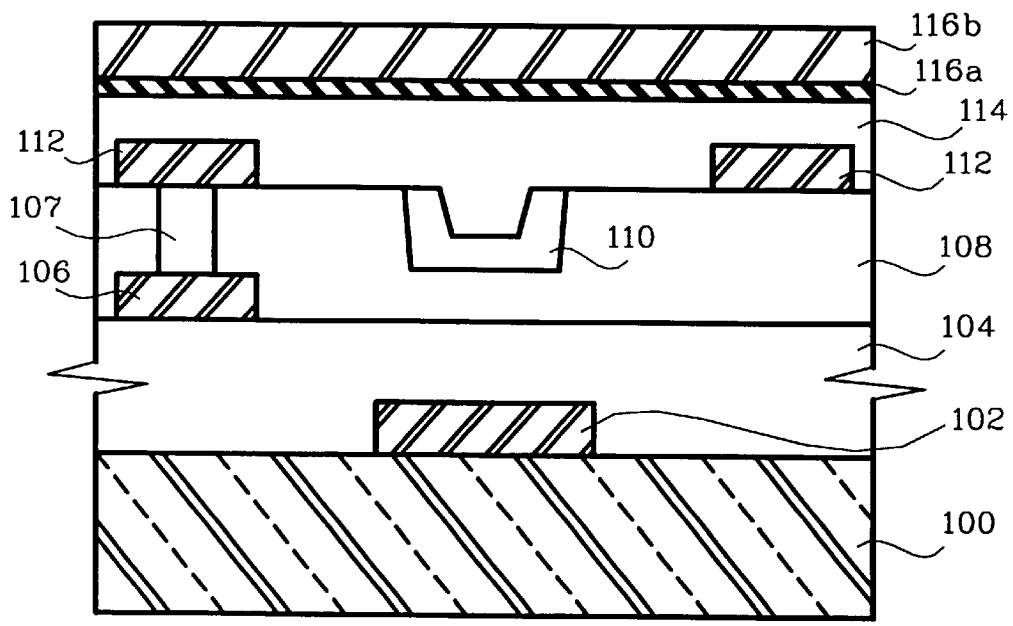

Referring to FIG. 8, the method of fabrication continues with a fuse metal layer 116a and wiring metal layer 116b being sequentially formed on the third interlevel insulating layer 114. The fuse metal layer 116a can be made in either a single structure of Titanium (Ti), or Titanium Nitrate (TIN), in a deposition structure of Titanium (Ti) and Titanium Nitrate (TIN) or in a deposition structure of Titanium (Ti) and Tungsten (W). The wiring metal layer 116b is preferably made from either an Aluminum (Al) or Copper (Cu) alloy.

Figure 9:
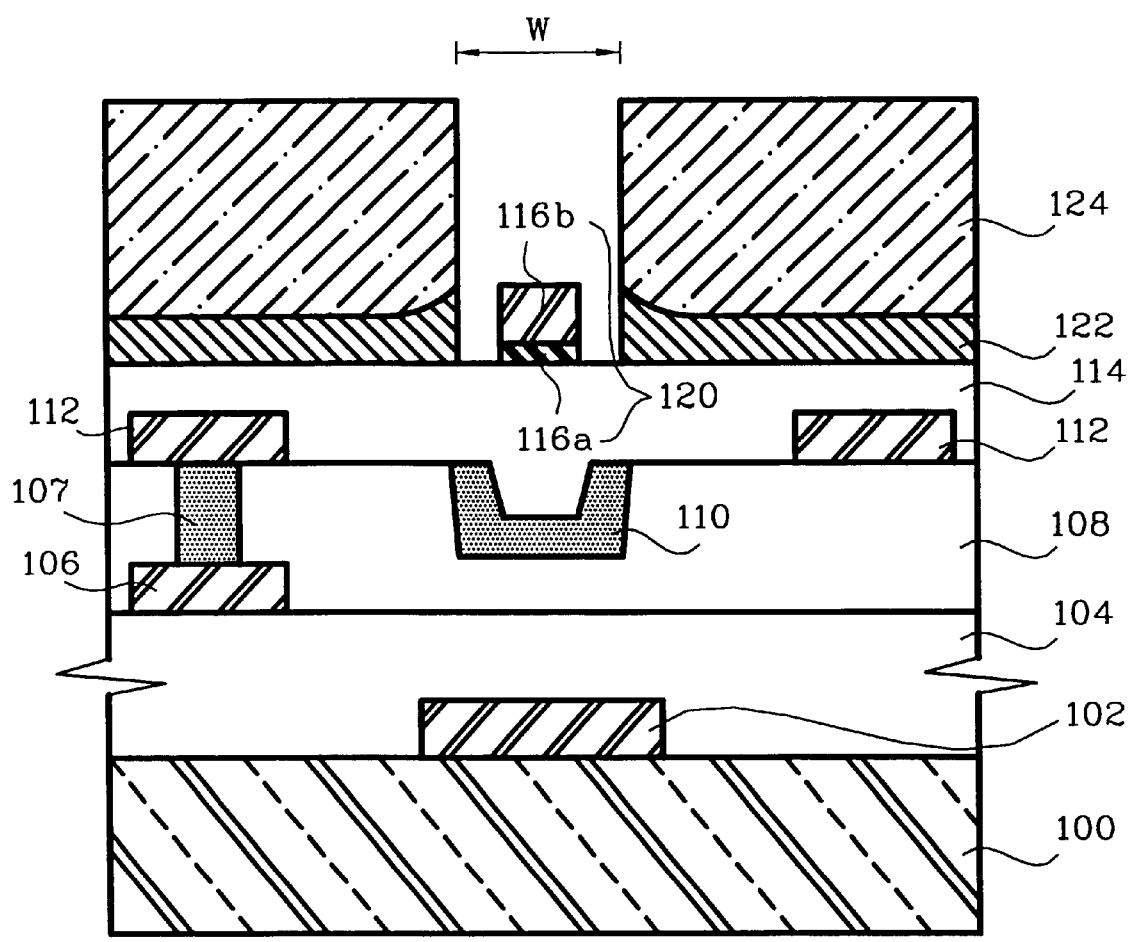

As shown in FIG. 9, predetermined portions of the third interlevel insulating layer 114, the wiring metal layer 116b and the fuse metal layer 116a are selectively etched out for simultaneously forming a fuse pattern 120 in the deposition structure of a fuse metal layer 116a and wiring metal layer 116b. A fourth metal wire 118, see FIG. 3, is also made in the same layer structure as the fuse pattern 120. The fuse pattern 120 extends horizontally across the heat blocking layer 110 on the third interlevel insulating layer 114. The fourth metal wire 118 is arranged to be integrally connected with a lateral edge of the fuse pattern 120. Then, a first protection layer 122 is formed on the third interlevel insulating layer 114 that includes the fuse pattern 120 and the fourth metal wire 118. A mask pattern 124 is then formed on the first protection layer 122 for restricting a pad window forming portion. The pad window forms the portion designated as W, as shown in FIG. 3. The first protection layer 122 is preferably made of an oxide layer such as a high density polyethylene (HDP) oxide, a polyethylene (PE)-oxide, a polyethylene—tetraethoxysilane, tetraethylorthosilicate, tetraethelorthosilicate, tetrethoxysilicide (PE-TEOS) and the like. Then, the first protection layer 122, in an area which is not protected by the mask pattern 124, is selectively etched for forming the fuse window W. As a result, predetermined portions of the surface of the third interlevel insulating layer 114, having the fuse pattern 120, can be exposed through the fuse window W.

Figure 10:
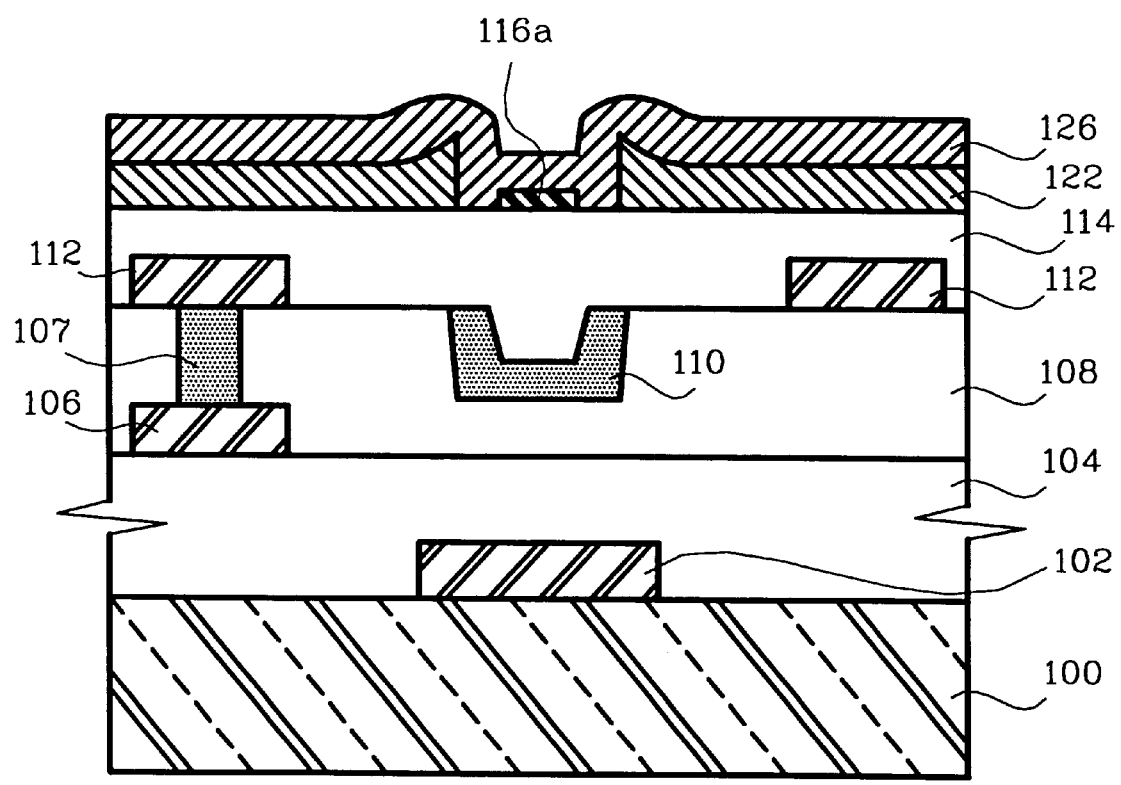

Referring to FIG. 10, the method continues with the surface of the fuse metal layer 116a being exposed by removing the mask pattern 124 and the wiring metal layer 116b. Then a second protection layer 126 of Silicon Nitrate (SiN) or a Polyamide is formed on the resultant structure. The fuse metal layer 116a is to be used as the fuse 1, as shown in FIG. 3.

In addition, the heat blocking layer 110 is made in a self-alignment process so that no additional process is required for fabricating the semiconductor device having a fuse, thereby taking advantage of a positive economic position.

While the invention has been described in terms of a single preferred embodiment, those skilled in the art will recognize that the invention can be practiced with modification within the spirit and scope of the appended claims.

What is claimed is:

1. A method for fabricating a semiconductor device having a fuse, comprising the steps of:
    forming a first interlevel insulating layer on a semiconductor substrate having a first metal wire;
    forming a second metal wire on the first interlevel insulating layer;
    forming a second interlevel insulating layer on the first interlevel insulating layer;
    forming a hole and a grooved portion for exposing a surface of the second metal wire embedded in the second interlevel insulating layer by selectively etching out a first predetermined region and a second predetermined region of the second interlevel insulating layer, respectively;
    forming a conductive plug in the hole and a heat blocking layer in the grooved portion from a metal;
    forming a third metal wire on the second interlevel insulating layer for connecting with the conductive plug;
    forming a third interlevel insulating layer on the second interlevel insulating layer;
    simultaneously forming a fuse pattern in a deposition structure of a fuse metal layer and a wiring metal layer on the third interlevel insulating layer; and
    forming a fourth metal wire for connection with a lateral edge of the fuse pattern.

2. The method for fabricating a semiconductor device as claimed in claim 1, further comprising the step of forming a first protection layer all over the structure resulted by all of the previous steps.

3. The method for fabricating a semiconductor device as claimed in claim 2, further comprising the steps of forming a fuse window by selectively etching out the first protection layer for keeping open predetermined surface portions of the fuse pattern positioned over the heat blocking layer; and
    etching out the wiring metal layer of the fuse pattern which is exposed through the fuse window and leaving only a fuse metal layer positioned in the fuse window.

4. The method for fabricating a semiconductor device as claimed in claim 3, further comprising the step of forming a second protection layer all over the structure resulted by all of the previous steps.

5. The method for fabricating a semiconductor device as claimed in claim 1, further comprising the step of forming the heat blocking layer to be larger than the fuse window.

6. The method for fabricating a semiconductor device as claimed in claim 1, wherein the step of forming a conductivity plug in the hole and a heat blocking layer in the grooved portion further comprises the steps of:
    forming a metal layer on the second interlevel insulating layer for completely filling in the hole and the grooved portion; and
    flattening the surface of the metal layer for allowing the surface of the second interlevel insulating layer to be exposed.

7. The method for fabricating a semiconductor device as claimed in claim 6, further comprising the steps of forming the metal layer from a material which comprises Tungsten (W) or Copper (Cu).

8. The method for fabricating a semiconductor device as claimed in claim 6, wherein the step of flattening the surface of the metal layer is done by either by a Chemical Mechanical Polishing (CMP) process or an etch-back process.

9. The method for fabricating a semiconductor device as claimed in claim 2, further comprising the step of forming the first protection layer from a material consisting of either a HDP oxide, PE-oxide or PE-TEOS.

10. The method for fabricating a semiconductor device as claimed in claim 4, further comprising the step of forming the second protection layer from a material consisting of either Silicon and Nitrogen (SiN) or a polyamide.

* * * * *